United States Patent
Yedidia et al.

(10) Patent No.: US 7,373,585 B2
(45) Date of Patent: May 13, 2008

(54) COMBINED-REPLICA GROUP-SHUFFLED ITERATIVE DECODING FOR ERROR-CORRECTING CODES

(75) Inventors: Jonathan S. Yedidia, Cambridge, MA (US); Marc P. C. Fossorier, Honolulu, HI (US); Juntan Zhang, Cambridge, MA (US); Yige Wang, Honolulu, HI (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 521 days.

(21) Appl. No.: 11/035,828

(22) Filed: Jan. 14, 2005

(65) Prior Publication Data

US 2006/0161830 A1  Jul. 20, 2006

(51) Int. Cl.
 *H03M 13/03* (2006.01)
(52) U.S. Cl. .................................... 714/786
(58) Field of Classification Search ............... 714/786, 714/755; 717/124, 126, 128, 131
 See application file for complete search history.

(56) References Cited

U.S. PATENT DOCUMENTS 5,721,745 A * 2/1998 Hladik et al. ............... 714/755
6,304,995 B1 * 10/2001 Smith et al. ................ 714/786
7,222,289 B2 * 5/2007 Hung ......................... 714/807

FOREIGN PATENT DOCUMENTS

EP        1024601        11/2000

OTHER PUBLICATIONS

Guilloud et al. "Architecture generique de decoder de codes LDPC," Jul. 2, 2004, pp. 26, 29-30, 38-40, 57-64.
Meshkat et al. "Generalized versions of turbo decoding in the framework of Bayesian networks and Pearl's belief propagation algorithm" IEEE international conference on communications, Jun. 7, 1998.
Zhang et al. "Parallel turbo decoding," IEEE international symposium on circuits and systems, May 23, 2004.
Argon et al. "A parallel decoder for low latency decoding of turbo product codes" IEEE communications letters, Feb. 2002.
Zhang et al. "Shuffled belief propagation decoding," Asilomar conference on signals, systems and computers, Nov. 3, 2002.

* cited by examiner

*Primary Examiner*—Shelly Chase
*Assistant Examiner*—Sam Rizk
(74) *Attorney, Agent, or Firm*—Dirk Brinkman; Clifton D. Mueller; Gene V. Vinokur

(57) ABSTRACT

A method generates a combined-replica group-shuffled iterative decoder. First, an error-correcting code and an iterative decoder for an error-correcting code is received. Multiple group-shuffled sub-decoders for the error-correcting code are constructed, based on the iterative decoder. Then, the multiple group-shuffled sub-decoders are combined into a combined-replica group-shuffled iterative decoder.

35 Claims, 8 Drawing Sheets

800

COMBINED-REPLICA GROUP-SHUFFLED ITERATIVE DECODING FOR ERROR-CORRECTING CODES

FIELD OF THE INVENTION

The present invention relates generally to decoding error-correcting codes, and more specifically to iteratively decoding error-correcting codes such as turbo-codes, low-density parity check codes, and turbo product codes.

BACKGROUND OF THE INVENTION

Error-Correcting Codes

A fundamental problem in the field of data storage and communication is the development of practical decoding methods for error-correcting codes.

One very important class of error-correcting codes is the class of linear block error-correcting codes. Unless specified otherwise, any reference to a "code" in the following description should be understood to refer to a linear block error-correcting code.

The basic idea behind these codes is to encode a block of k information symbols using a block of N symbols, where N>k. The additional N-k bits are used to correct corrupted signals when they are received over a noisy channel or retrieved from faulty storage media.

A block of N symbols that satisfies all the constraints of the code is called a "code-word," and the corresponding block of k information symbols is called an "information block." The symbols are assumed to be drawn from a q-ary alphabet.

An important special case is when q=2. In this case, the code is called a "binary" code. In the examples given in this description, binary codes are assumed, although the generalization of the decoding methods described herein to q-ary codes with q>2 is straightforward. Binary codes are the most important codes used in practice.

FIG. 1 shows a conventional "channel coding" 100 with a linear block error-correcting code. A source 110 produces an information block 101 of k symbols u[a]. The information block is passed to an encoder 120 of the error-correcting code. The encoder produces a code-word x[n] containing N symbols 102.

The code-word 102 is then transmitted through a channel 130, where the code-word is possibly corrupted into a signal y[n] 103. The corrupted signal y[n] 103 is then passed to a decoder 140, which attempts to output a reconstruction 104 z[n] of the code-word x[n] 102.

Code Parameters

A binary linear block code is defined by a set of $2^k$ possible code-words having a block length N. The parameter k is sometimes called the "dimension" of the code. Codes are normally much more effective when N and k are large. However, as the size of the parameters N and k increases, so does the difficulty of decoding corrupted messages.

The Hamming distance between two code-words is defined as the number of symbols that differ in two words. The distance d of a code is defined as the minimum Hamming distance between all pairs of code-words in the code. Codes with a larger value of d have a better error-correcting capability. Codes with parameters N and k are referred to as [N,k] codes. If the distance d is also known, then the codes are referred to as [N,k,d] codes.

Code Parity Check Matrix Representations

A linear code can be represented by a parity check matrix. The parity check matrix representing a binary [N,k] code is a matrix of zeros and ones, with M rows and N columns. The N columns of the parity check matrix correspond to the N symbols of the code. The number of linearly independent rows in the matrix is N-k.

Each row of the parity check matrix represents a parity check constraint. The symbols involved in the constraint represented by a particular row correspond to the columns that have a non-zero symbol in that row. The parity check constraint forces the weighted sum modulo-2 of those symbols to be equal to zero. For example, for a binary code, the parity check matrix $$H = \begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{bmatrix} \quad (4)$$

represents the three constraints $$x[1]+x[2]+x[3]+x[5]=0 \quad (5)$$

$$x[2]+x[3]+x[4]+x[6]=0 \quad (6)$$

$$x[3]+x[4]+x[5]+x[7]=0 \quad (7)$$

where x[n] is the value of the $n^{th}$ bit, and the addition of binary symbols is done using the rules of modulo-2 arithmetic, such that 0+0=1+1=0, and 0+1=1+0=1.

Error-Correcting Code Decoders

The task of a decoder for an error-correcting code is to accept the received signal after the transmitted code-word has been corrupted in a channel, and try to reconstruct the transmitted code-word. The optimal decoder, in terms of minimizing the number of code-word decoding failures, outputs the most likely code-word given the received signal. The optimal decoder is known as a "maximum likelihood" decoder. Even a maximum likelihood decoder will sometimes make a decoding error and output a code-word that is not the transmitted code-word if the noise in the channel is sufficiently great.

Another type of decoder, which is optimal in terms of minimizing the symbol error rate rather than the word error rate, is an "exact-symbol" decoder. This name is actually not conventional, but is used here because there is no universally agreed-upon name for such decoders. The exact-symbol decoder outputs, for each symbol in the code, the exact probability that the symbol takes on its various possible values, e.g., 0 or 1 for a binary code.

Iterative Decoders

In practice, maximum likelihood or exact-symbol decoders can only be constructed for special classes of error-correcting codes. There has been a great deal of interest in non-optimal, approximate decoders based on iterative methods. One of these iterative decoding methods is called "belief propagation" (BP). Although he did not call it by that name, R. Gallager first described a BP decoding method for low-density parity check (LDPC) codes in 1963.

Turbo Codes

In 1993, similar iterative methods were shown to perform very well for a new class of codes known as "turbo-codes." The success of turbo-codes was partially responsible for greatly renewed interest in LDPC codes and iterative decoding methods. There has been a considerable amount of recent work to improve the performance of iterative decoding methods for both turbo-codes and LDPC codes, and other related codes such as "turbo product codes" and "repeat-accumulate codes." For example a special issue of the IEEE Communications Magazine was devoted to this work in August 2003. For an overview, see C. Berrou, "*The Ten-Year-Old Turbo Codes are entering into Service*," IEEE Communications Magazine, vol. 41, pp. 110-117, August 2003 and T. Richardson and R. Urbanke, "*The Renaissance of Gallager's Low-Density Parity Check Codes*," IEEE Communications Magazine, vol. 41, pp. 126-131, August 2003.

Many turbo-codes and LDPC codes are constructed using random constructions. For example, Gallager's original binary LDPC codes are defined in terms of a parity check matrix, which consists only of 0's and 1's, where a small number of 1's are placed randomly within the matrix according to a pre-defined probability distribution. However, iterative decoders have also been successfully applied to codes that are defined by regular constructions, like codes defined by finite geometries, see Y. Kou, S. Lin, and M. Fossorier, "Low Density Parity Check Codes Based on Finite Geometries: A Rediscovery and More," IEEE Transactions on Information Theory, vol. 47, pp. 2711-2736, November, 2001. In general, iterative decoders work well for codes with a parity check matrix that has a relatively small number of non-zero entries, whether that parity check matrix has a random or regular construction.

FIG. 2 shows a prior art system 200 with a decoder of an LDPC code based on BP. The system processes the received symbols iteratively to improve the reliability of each symbol based on the constraints, as given by the parity check matrix that specifies the code.

In a first iteration, the BP decoder only uses channel evidence 201 as input, and generates soft output messages 202 from each symbol to the parity check constraints involving that symbol. This step of sending messages from the symbols to the constraints is sometimes called the "vertical" step 210. Then, the messages from the symbols are processed at the neighboring constraints to feed back new messages 203 to the symbols. This step is sometimes called the "horizontal" step 220. The decoding iteration process continues to alternate between vertical and horizontal steps until a certain termination condition 204 is satisfied. At that point, hard decisions 205 are made for each symbol based on the output reliability measures for symbols from the last decoding iteration.

The precise form of the message update rules, and the meaning of the messages, varies according to the particular variant of the BP method that is used. Two particularly popular message-update rules are the "sum-product" rules and the "min-sum" rules. These prior-art message update rules are very well known, and approximations to these message update rules also have proven to work well in practice. In some variants of the BP method, the messages represent the log-likelihood that a bit is either a 0 or a 1. For more background material on the BP method and its application to error-correcting codes, see F. R. Kschischang, B. J. Frey, and H.-A. Loeliger, "Factor Graphs and the Sum-Product Algorithm," IEEE Transactions on Information Theory, vol 47, pp. 498-519, February 2001.

It is sometimes useful to think of the messages from symbols to constraints as being the "fundamental" independent messages that are tracked in BP decoding, and the messages from constraints to symbols as being dependent messages that are defined in terms of the messages from symbols to constraints. Alternatively, one can view the messages from constraints to symbols as being the "independent" messages, and the messages from symbols to constraints as being "dependent" messages defined in terms of the messages from constraints to symbols.

Bit-Flipping Decoders

Bit-flipping (BF) decoders are iterative decoders that work similarly to BP decoders. These decoders are somewhat simpler. Bit-flipping decoders for LDPC codes also have a long history, and were also suggested by Gallager in the early 1960's when he introduced LDPC codes. In a bit-flipping decoder, each code-word bit is initially assigned to be a 0 or a 1 based on the channel output. Then, at each iteration, the syndrome for each parity check is computed. The syndrome for a parity check is 0 if the parity check is satisfied, and 1 if it is unsatisfied. Then, for each bit, the syndromes of all the parity checks that contain that bit are checked. If a number of those parity checks greater than a pre-defined threshold are unsatisfied, then the corresponding bit is flipped. The iterations continue until all the parity checks are satisfied or a predetermined maximum number of iterations is reached.

A turbo-code is a concatenation of two smaller codes that can be decoded using exact-symbol decoders, see C. Berrou and A. Glavieux, "Near-Optimum Error-Correcting Coding and Decoding: Turbo-codes," IEEE Transactions in Communications, vol. 44, pp. 1261-1271, October 1996. Convolutional codes are typically used for the smaller codes, and the exact-symbol decoders are usually based on the BCJR decoding method; see L. Bahl, J. Cocke, F. Jelinek, and J. Raviv, "Optimal Decoding of Linear Codes for Minimizing Symbol Error Rate," IEEE Transactions on Information Theory, pp. 284-287, March 1974 for a detailed description of the BCJR decoding method. Some of the code-word symbols in a turbo-code have constraints imposed by both codes. These symbols are called "shared symbols." A conventional turbo-code decoder functions by alternately decoding the codes using their exact-symbol decoders, and utilizing the output log-likelihoods for the shared symbols determined by one exact-symbol decoder as inputs for the shared symbols in the other exact-symbol decoder.

The structure of a turbo-code constructed using two systematic convolutional codes 301 and 302 is shown schematically in FIG. 3. In this turbo-code, the shared symbols are the information bits for each of the convolutional codes.

The simplest turbo-decoders operate in a serial mode. In this mode, one of the BCJR decoders receives as input the channel information, and then outputs a set of log-likelihood values for each of the shared information bits. Together with the channel information, these log-likelihood values are used as input for the other BCJR decoder, which sends back its output to the first decoder and then the cycle continues.

Turbo Product Code

A turbo product code (TPC) is a type of product code wherein each constituent code can be decoded using an exact-symbol decoder. Product codes are well-known prior-art codes. To construct a product code from a $[N_1,k_1,d_1]$ code and a $[N_2,k_2,d_2]$ code, one arranges the code-word symbols in a $N_1$ by $N_2$ rectangle. Each symbol belongs to two codes—one a $[N_1,k_1,d_1]$ "vertical" code constructed using the other symbols in the same column, and the other a $[N_2,k_2,d_2]$ "horizontal" code constructed using the other symbols in the same row. The overall product code has parameters $[N_1N_2,k_1k_2,d_1d_2]$.

The TPC is decoded using the exact-symbol decoders of the constituent codes. The horizontal codes and vertical codes are alternately decoded using their exact-symbol decoders, and the output log-likelihoods given by the horizontal codes are used as input log-likelihoods for the vertical codes, and vice-versa. This method of decoding turbo product codes is called "serial-mode decoding."

Other Codes that can be Decoded Iteratively

There are many other codes that can successfully be decoded using iterative decoding methods. Those codes are well-known in the literature and there are too many of them to describe them all in detail. Some of the most notable of those codes are the irregular LDPC codes, see M. A. Shokrollahi, D. A. Spielman, M. G. Luby, and M. Mitzenmacher, "Improved Low-Density Parity Check Codes Using Irregular Graphs," IEEE Trans. Information Theory, vol. 47, pp. 585-598 February 2001; the repeat-accumulate codes, see D. Divsalar, H. Jin, and R. J. McEliece, "Coding Theorems for 'Turbo-like' Codes," Proc. $36^{th}$ Allerton Conference on Communication, Control, and Computing, pp. 201-210, September, 1998; the LT codes, see M. Luby, "LT Codes," Proc. Of the 43 Annual IEEE Symposium on Foundations of Computer Science, pp. 271-282, November 2002; and the Raptor codes, see A. Shokrollahi, "Raptor Codes," Proceedings of the IEEE International Symposium on Information Theory, p. 36, July 2004.

Methods to Speed Up Iterative Decoders

BP and BF decoders for LDPC codes, decoders for turbo codes, and decoders for turbo product codes are all examples of iterative decoders that have proven useful in practical systems. A very important issue for all those iterative decoders is the speed of convergence of the decoder. It is desired that the number of iterations required before finding a code-word is as small as possible. A smaller number of iterations results in faster decoding, which is a desired feature for error-correction systems.

For turbo-codes, faster convergence can be obtained by operating the turbo-decoder in parallel mode, see D. Divsalar and F. Pollara, "Multiple Turbo Codes for Deep-Space Communications," JPL TDA Progress Report, pp. 71-78, May 1995. In that mode, both BCJR decoders simultaneously receive as input the channel information, and then simultaneously output a set of log-likelihood values for the information bits. The outputs from the first decoder are used as inputs for the second iteration of the second decoder and vice versa.

FIG. 4 shows the difference between operating a turbo-code in serial 401 and parallel 402 modes for one iteration in each of the modes. In serial mode 401, the first decoder 411 operates first, and its output is used by the second decoder 412, and then the output from the second decoder is returned to be used by the first decoder in a next iteration. In parallel mode 402, the two decoders 421-422 operate in parallel, and the output of the first decoder is sent to the second decoder for the next iteration while simultaneously the output of the second decoder is sent to the first decoder.

Similarly to the case for turbo-codes, parallel-mode decoding for turbo product codes is described by C. Argon and S. McLaughlin, "A Parallel Decoder for Low Latency Decoding of Turbo product Codes," IEEE Communications Letters, vol. 6, pp. 70-72, February 2002. In parallel-mode decoding of turbo product codes, the horizontal and vertical codes are decoded concurrently, and in the next iteration, the outputs of the horizontal codes are used as inputs for the vertical codes, and vice versa.

Group Shuffled Decoding

Finally, for BP decoding of LDPC codes, "group shuffled" BP decoding is described by J. Zhang and M. Fossorier, "Shuffled Belief Propagation Decoding," Proceedings of the $36^{th}$ Annual Asilomar Conference on Signals, Systems, and Computers, pp. 8-15, November 2002.

In ordinary BP decoding, as described above, messages from all bits are updated in parallel in a single vertical step. In group-shuffled BP decoding, the bits are partitioned into groups. The messages from a group of bits to their corresponding constraints are updated together, and then, the messages from the next group of bits are updated, and so on, until the messages from all the groups are updated, and then the next iteration begins. The messages from constraints to bits are treated as dependent messages. At each stage, the latest updated messages are used. Group shuffled BP decoding improves the performance and convergence speed of decoders for LDPC codes compared to ordinary BP decoders.

Intuitively, the reason that the parallel-mode decoders for turbo-codes and turbo product codes, and the group-shuffled decoders for LDPC codes speed up convergence is as follows. Whenever a message is updated in an iterative decoder, it becomes more accurate and reliable. Therefore, using the most recent version of a message, rather than older versions, normally increases speed convergence to the correct decoding.

Although the prior-art methods do give some improvement in speed of convergence, it is strongly desired to further improve convergence speed and performance. In many applications, the speed of decoding is of critical importance.

SUMMARY OF THE INVENTION

The present invention provides a method for converting a decoder of any iteratively decodable code such as an LDPC code or a turbo-code or a turbo product code to another iterative decoder with better performance and speed of convergence. The converted iterative decoder is called a "combined-replica group-shuffled decoder," or simply a "combined decoder."

The method takes as input an error-correcting code, and a conventional iterative decoder for that error-correcting code that updates bit or symbol estimates in parallel. For example, the symbols are taken from an arbitrary alphabet. The bit or symbol estimates can be messages or values of bits or symbols.

The combined decoder is constructed from multiple replicas of smaller sub-decoders. Each of the smaller sub-decoders is called a "group-shuffled sub-decoder."

In each group-shuffled sub-decoder, the bit or symbol estimates that are updated by a conventional iterative decoder are partitioned into groups. The group-shuffled sub-decoders that are used in a combined decoder differ as follows. Each sub-decoder uses a different updating schedule for the various groups. The sub-decoders can also differ in the way bit or symbol estimates are partitioned into groups.

The combined-replica group-shuffled decoder utilizes the outputs of its constituent group-shuffled sub-decoders in the following way. Whenever a bit or symbol value or message is updated in each group-shuffled sub-decoder, a certain number of other bit or symbol values or messages are used to make the update. The other bit or symbol values or messages are obtained by using the estimates provided by the group-shuffled sub-decoder that most recently updated that bit or symbol value or message.

The combined decoder completes when a termination condition is reached, such as decoding a code-word or reaching a predetermined number-of iterations.

DETAILED DESCRIPTION OF THE PREFERRED EMBODIMENT

Figure 1:
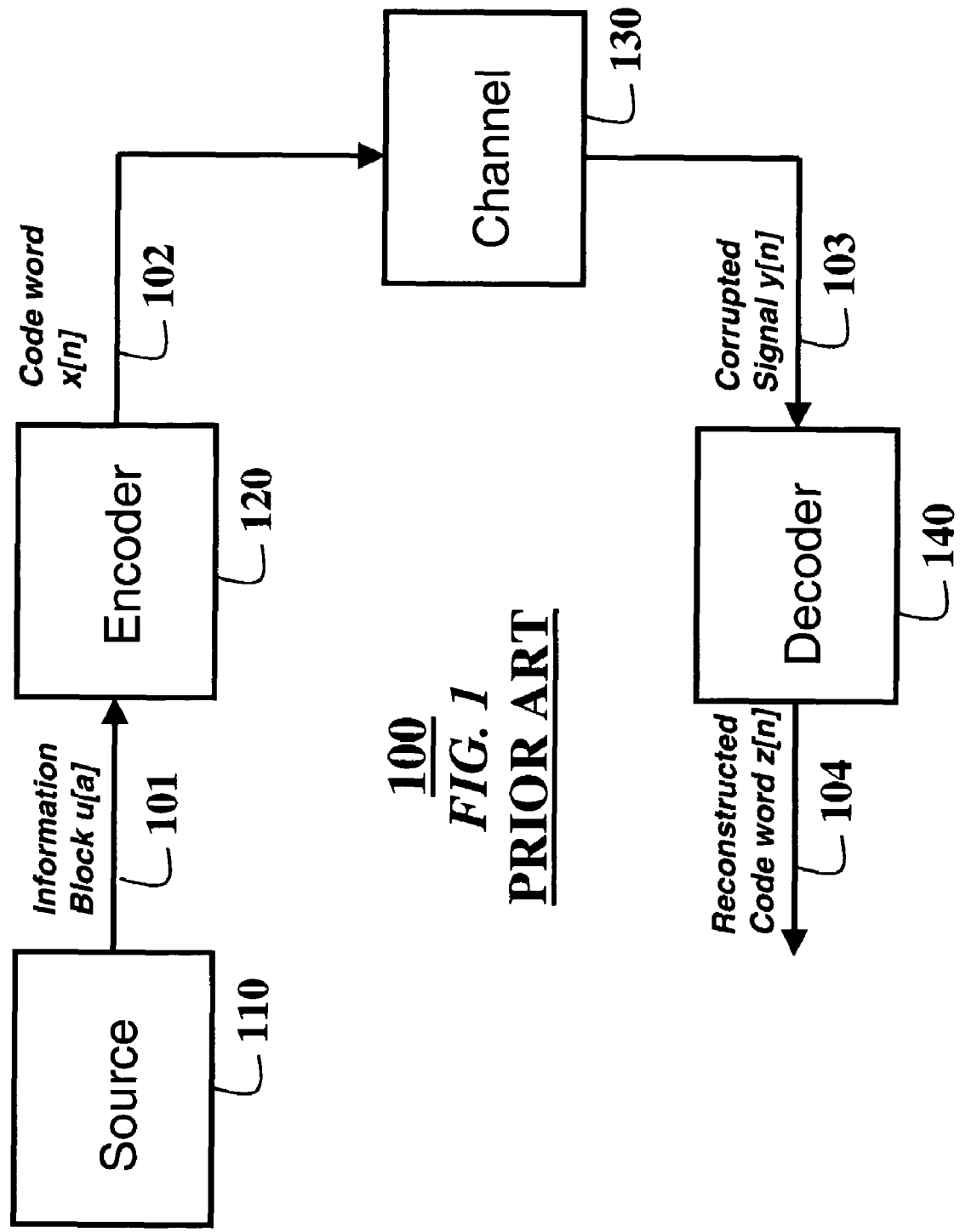
FIG. 1 is a block diagram of prior art channel coding.
Figure 2:
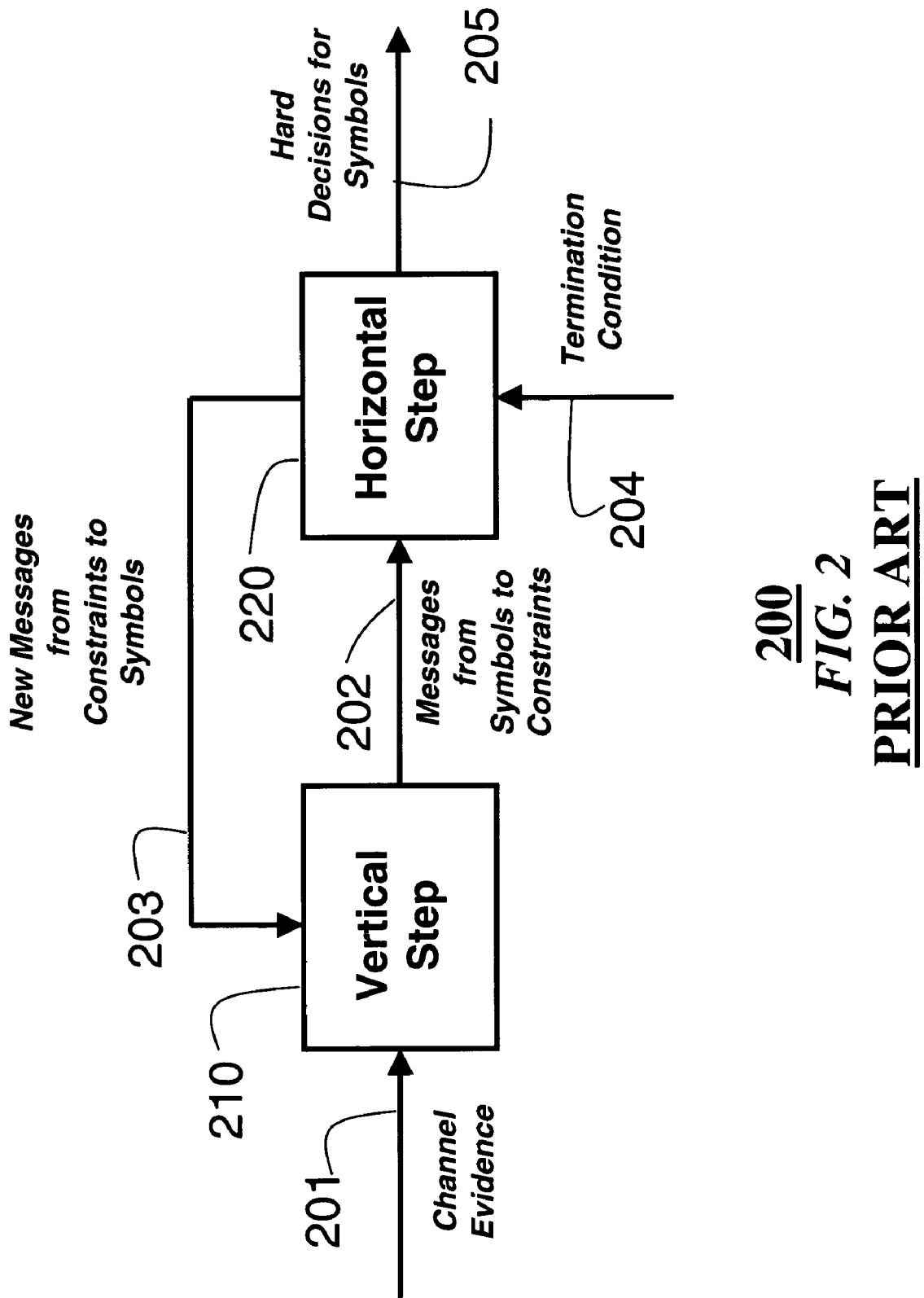
FIG. 2 is a block diagram of a prior art belief propagation decoding.
Figure 3:
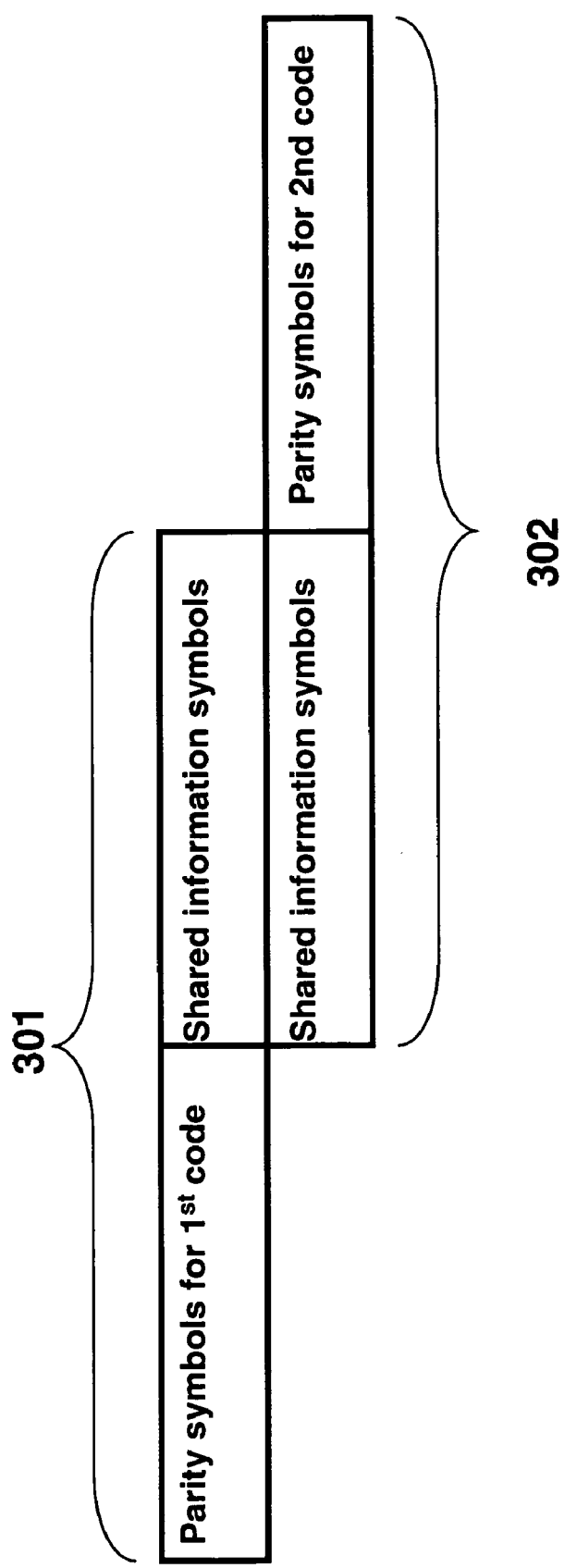
FIG. 3 is a schematic diagram of a prior art turbo-code.
Figure 4:
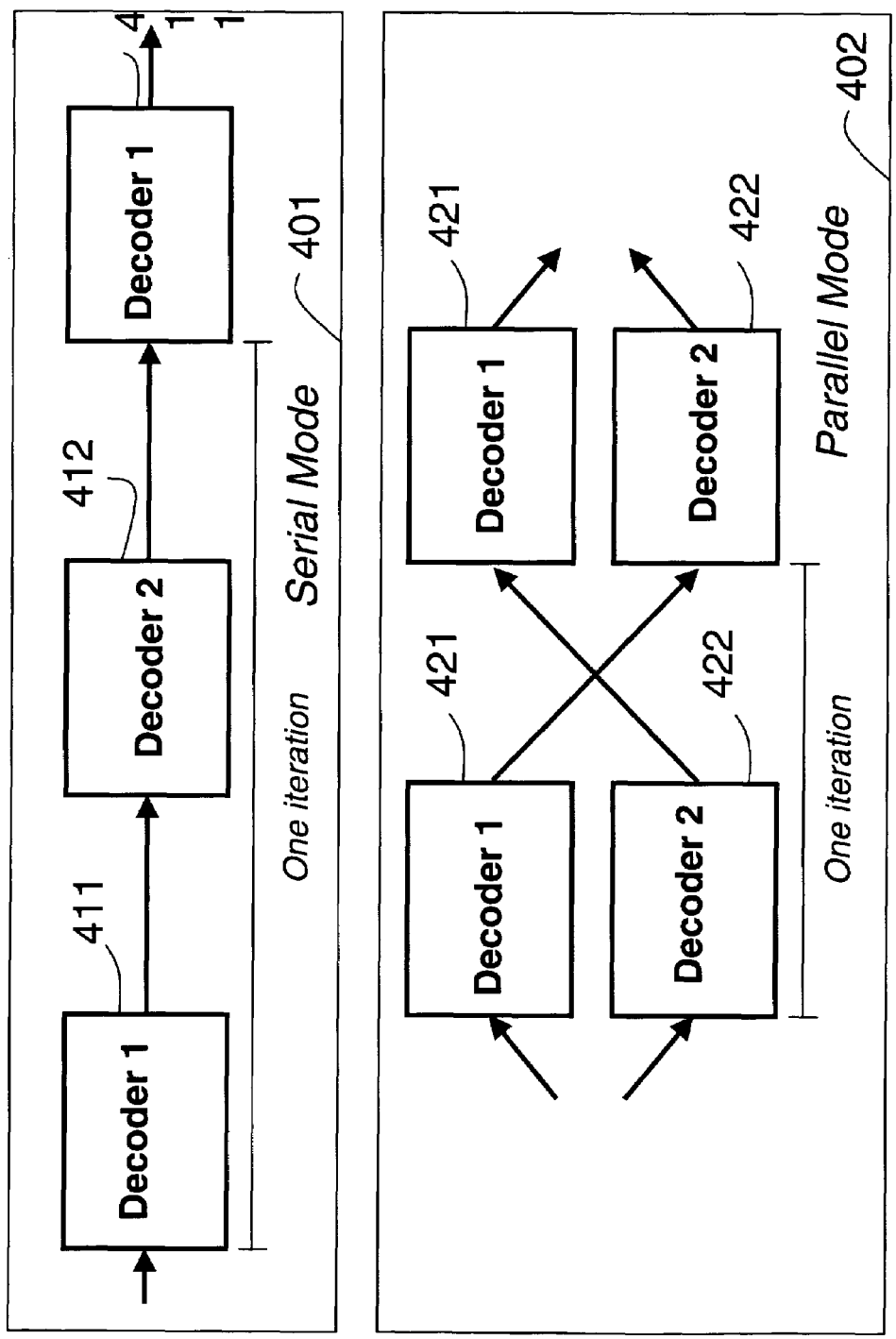
FIG. 4 is a block diagram of prior art serial and parallel turbo coding.
Figure 5:
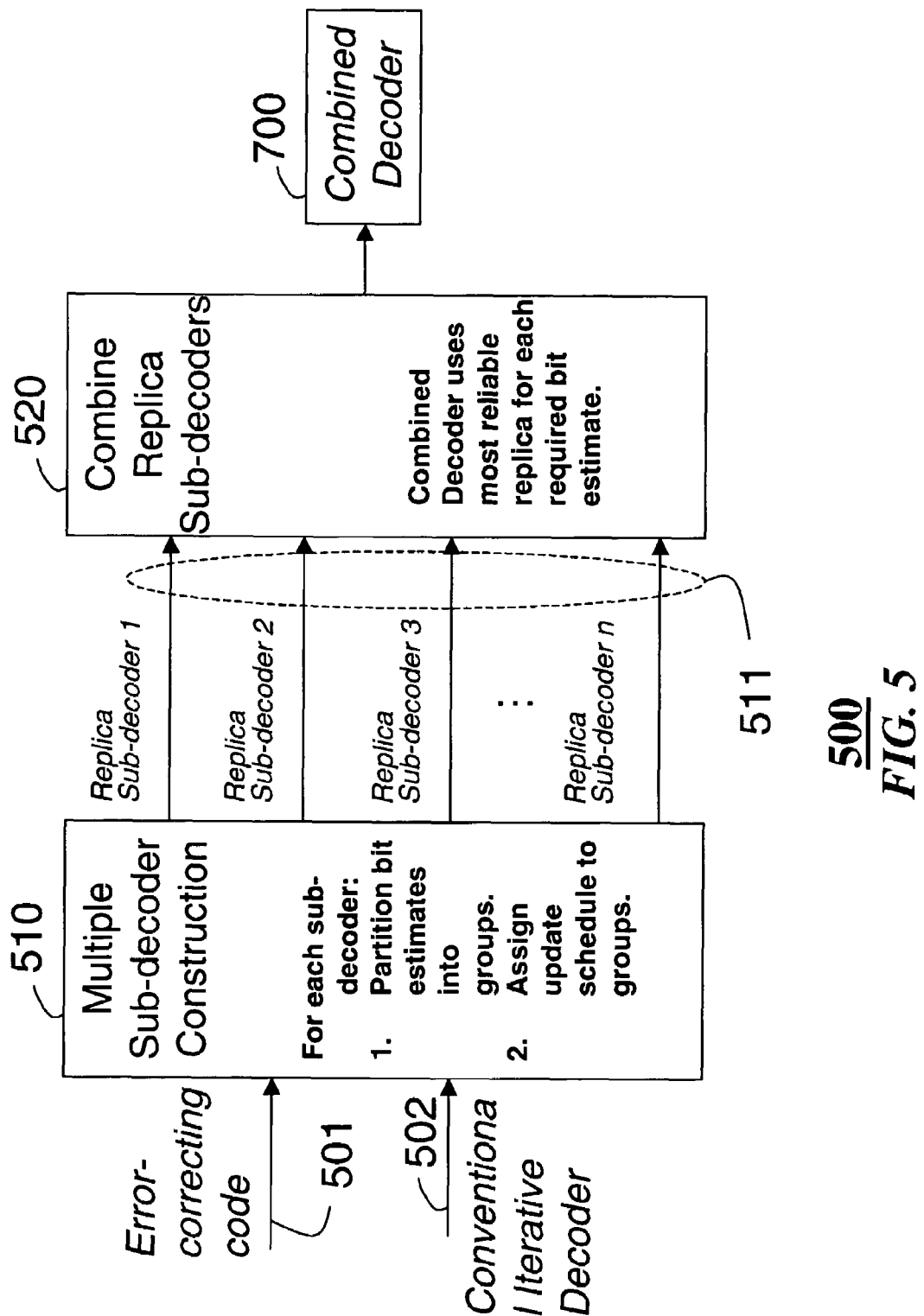
FIG. 5 is a flow diagram of a method for generating a combined-replica, group-shuffled, iterative decoder according to the invention.

FIG. 5 shows a method for generating 500 a combined-replica, group-shuffled, iterative decoder 700 according to our invention.

The method takes as input an error-correcting code 501 and a conventional iterative decoder 502 for the error-correcting code 501. The conventional iterative decoder 502 iteratively and in parallel updates estimates of states of symbols defining the code based on previous estimates. The symbols can be binary or taken from an arbitrary alphabet. Messages in belief propagation (BP) methods and states of bits in bit-flipping (BF) decoders are examples of what we refer to generically as "symbol estimates" or simply "estimates" for the states of symbols.

We also use the terminology of "bit estimates" because for simplicity the symbols are assumed to be binary, unless stated otherwise. However the approach also applies to other non binary codes. Prior-art BP decoders, BF decoders, turbo-decoders, and decoders for turbo product codes are all examples of conventional iterative decoders that can be used with our invention.

To simplify this description, we use BF and BP decoders for binary LDPC codes as our primary examples of the input conventional iterative decoders 501. It should be understood that the method can be generalized to other examples of conventional iterative decoders, not necessarily binary.

In a BF decoder for a binary LDPC code, the estimates for the values of each code-word symbol are stored and updated directly. Starting with an initial estimate based on a most likely state given the channel output, each code-word bit is estimated as either 0 or 1. At every iteration, the estimates for each symbol are updated in parallel. The updates are made by checking how many parity checks associated with each bit are violated. If a number of checks that are violated is greater than some pre-defined threshold, then the estimate for that bit is updated from a 0 to a 1 or vice versa.

A BP decoder for a binary LDPC code functions similarly, except that instead of updating a single estimate for the value of each symbol, a set of "messages" between the symbols and the constraints in which the messages are involved are updated. These messages are typically stored as real numbers. The real numbers correspond to a log-likelihood ratio that a bit is a 0 or 1. In the BP decoder, the messages are iteratively updated according to message-update rules. The exact form of these rules is not important. The only important point is that the iterative decoder uses some set of rules to iteratively update its messages based on previously updated messages.

Constructing Multiple Sub-decoders

In the first stage of the transformation process according to our method, multiple replicas of the group-shuffled sub-decoders are constructed. These group-shuffled sub-decoders 511 are then combined 520 into the combined-replica group-shuffled decoder 700.

Partitioning Estimates into Groups

The multiple replica sub-decoders 511 are constructed as follows. For each group-shuffled replica sub-decoder 511, the estimates that the group-shuffled sub-decoder makes for the messages or the symbol values are partitioned into groups.

An example BF decoder for a binary LDPC code has one thousand code-word bits. We can divide the bit estimates that the group-shuffled sub-decoder makes for this code in any number of ways, e.g., into ten groups of a hundred bits, or a hundred groups of ten bits, or twenty groups of fifty bits, and so forth. For the sake of simplicity, we assume hereafter that the groups are of equal size.

If the conventional iterative decoder 501 is a BP decoder of the LDPC code, the groups of messages can be partitioned in many different ways in each group-shuffled sub-decoder. We describe two preferred techniques. In the first technique, which we refer to as a "vertical partition," the code-word symbols are first partitioned into groups, and then all messages from the same code-word symbol to the constraints are treated as belonging to the same group. In the vertical partition, the messages from constraints to symbols are treated as dependent messages, while the messages from the symbols to the constraints are treated as independent messages. Thus, all dependent messages are automatically updated whenever a group of independent messages from symbols to constraints are updated.

In the second technique, which we will refer to as a "horizontal partition," the constraints are first partitioned into groups, and then all messages from the same constraint to the symbols are treated as belonging to the same group. In the horizontal partition, the messages from constraints to symbols are treated as the independent messages, and the messages from the symbols to the constraints are merely dependent messages. Again, all dependent messages are updated automatically whenever a group of independent messages are updated.

Other approaches for partitioning the BP messages are possible. The essential point is that for each replica of the group-shuffled sub-decoder, we define a set of independent messages that are updated in the course of the iterative decoding method, and divide the messages into some set of groups. Other dependent messages defined in terms of the independent messages are automatically updated whenever the updating of a group of independent messages completes.

Assigning Update Schedules to Groups

The next step in generating a single group-shuffled sub-decoder 511 assigns an update schedule for the groups of estimates. An update schedule is an ordering of the groups, which defines the order in which the estimates are updated. For example, if we want to assign an update schedule to ten groups of 100 bits in the BF decoder, we determine which group of bits is updated first, which group is updated second, and so on, until we reach the tenth group. We refer to the sub-steps of a single iteration when a group of bit estimates is updated together as a "iteration sub-step."

The set of groups along with the update schedule for the groups, defines a particular group-shuffled iterative sub-decoder. Aside from the fact that the groups of estimates are updated in sub-steps according to the specified order, the group-shuffled, iterative sub-decoder functions similarly to the original conventional iterative decoder 501. For example, if the input conventional iterative decoder 501 is the BF decoder, then the new group-shuffled sub-decoder 511 uses identical bit-flipping rules as the conventional decoder 501.

Differences between Replica Sub-decoders used in Combined Decoders

The multiple group-shuffled sub-decoders 511 may or may not be identical in terms of the way that the sub-decoders are partitioned into groups. However, the sub-decoders are different in terms of their update schedules. In fact, it is not necessary that every bit estimate is updated in every replica sub-decoder used in the combined decoder 700. However, every bit estimate is updated in at least one of the replica sub-decoders 511. We also prefer that each replica sub-decoder 511 has the same number of iteration sub-steps, so that each iteration of the combined decoder completes synchronously.

Figure 6:
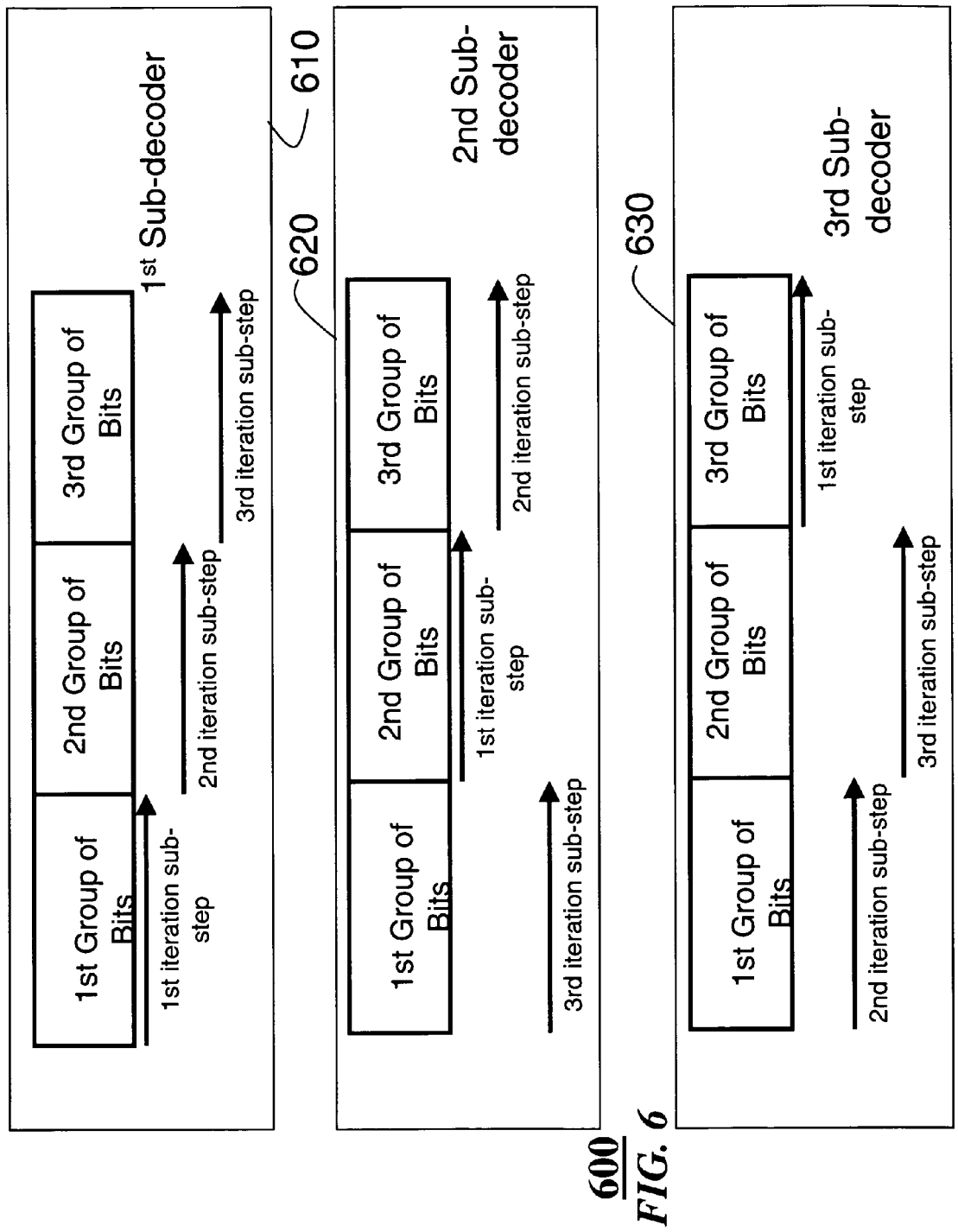
FIG. 6 is a schematic diagram of replicated sub-decoders.

FIG. 6 shows a simple schematic example of replicated group-shuffled sub-decoders. In this example, we used three different replica sub-decoders, each having three groups of bit estimates. In this example, the groups used in each replica sub-decoder are identical, but the updating order is different.

In the first replica sub-decoder 610, the bit estimates in group 1 is updated in the first iteration sub-step, followed by the bit estimates in group 2 in the second iteration sub-step, followed by the bit estimates in group 3 in the third iteration sub-step. In the second replica sub-decoder 620, the bit estimates in group 2 are updated first, followed by the bit estimates in group 3, followed by the bit estimates in group 1. In the third replica sub-decoder 630, the bit estimates in group 3 are updated first, followed by the bit estimates in group 1, followed by the bit estimates in group 2.

The idea behind our combined-replica group-shuffled decoders is described using this example. Consider the first iteration, for which the input estimate for each bit is obtained using channel information. We expect that the initial input 'reliability' of each bit to be equal. However, after the first sub-step of the first iteration is complete, the bits that were most recently updated should be most reliable. Thus, in our example, we expect that for the first replica sub-decoder, the bit estimates in group 1 are the most reliable at the end of the first sub-step of the first iteration, while in the second replica sub-decoder, the bit estimates in group 2 are the most reliable at the end of the first sub-step of the first iteration.

In order to speed up the rate at which reliable information is propagated, it makes sense to use the most reliable estimates at each step. The general idea behind constructing a combined decoder from multiple replica group-shuffled sub-decoders is that we trade off greater complexity, e.g., logic circuits and memory, in exchange for an improvement in processing speed. In many applications, the speed at which the decoder functions is much more important than the complexity of the decoder, so this trade-off makes sense.

Combining Multiple Replica Sub-decoders

The decoder 700 is a combination of the different replicas of group-shuffled sub-decoders 511 obtained in the previous step 510.

Whenever a bit estimate is updated in an iterative decoder, the updating rule uses other bit estimates. In the combined decoder, which uses the multiple replica sub-decoders, the bit estimates that are used at every iteration are selected to be the most reliable estimates, i.e., the most recently updated bit estimates.

Thus, to continue our example, if we combine the three replica sub-decoders described above, then the replica decoders update their bit estimates in the first iteration as follows. In the first sub-step of the first iteration, the first replica sub-decoder updates the bit estimates in group 1, the second replica sub-decoder updates the bit estimates in group 2, and the third replica sub-decoder updates the bit estimates in group 3.

After the first sub-step is complete, the replica sub-decoders update the second group of bit estimates. Thus, the first replica sub-decoder updates the bit estimates in group 2, the second replica sub-decoder updates the bit estimates in group 3, and the third replica sub-decoder updates the bit estimates in group 1.

The important point is that whenever a bit estimate is needed to do an update, the replica sub-decoder is provided with the estimate from the currently most reliable sub-decoder for that bit. Thus, during the second sub-step, whenever a bit estimate for a bit in group 1 is needed, the estimate is provided by the first replica sub-decoder, while whenever a bit estimate for a bit in group 2 is needed, this estimate is provided by the second replica sub-decoder.

After the second sub-step of the first iteration is complete, the roles of the different replica sub-decoders change. The first replica decoder is now the source for the most reliable bit estimates for bits in group 2, the second replica sub-decoder is now the source for the most reliable bit estimates for bits in group 3, and the third replica sub-decoder is now the source for the most reliable bit estimates for bits in group 1.

The general idea behind the way the replica decoders 511 are combined in the combined decoder 700 is that at each iteration, a particular replica sub-decoder "specializes" in giving reliable estimates for some of the bits and messages, while other replica sub-decoders specialize in giving reliable estimates for other bits and messages. The "specialist" replica decoder for a particular bit estimate is always that replica decoder which most recently updated its version of that bit estimate.

System Diagram for Generic Combined Decoder

Figure 7:
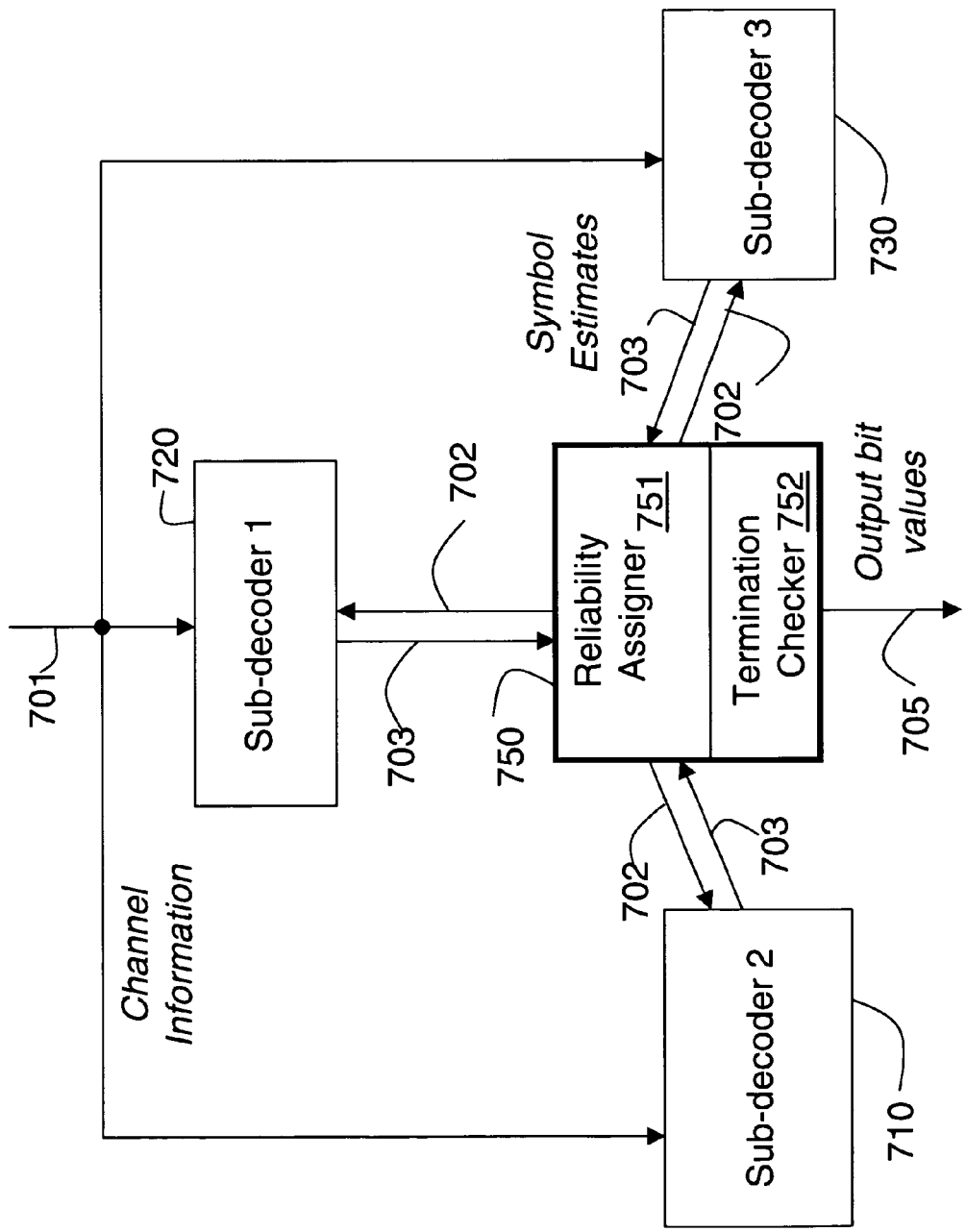
FIG. 7 is a diagram of a combined-replica, group-shuffled, iterative decoder according to the invention.

FIG. 7 shows a combined decoder 700. For simplicity, we show a combined decoder that uses three group-shuffled sub-decoders 710, 720, and 730. Each sub-decoder partitions estimates into a set of groups, and has a schedule by which the sub- it updates the estimates.

The overall control of the combined decoder is handled by a control block 750. The control block consists of two parts: reliability assigner 751; and a termination checker 752.

Each sub-decoder receives as input the channel information 701 and the latest bit estimates 702 from the control block 750. After each iteration sub-step, each sub-decoder outputs bit estimates 703 to the control block. To determine the output a particular sub-decoder applies the pre-assigned iterative decoder, e.g., BP or BF, using its particular schedule.

After each iteration sub-step, the control block receives as inputs the latest bit estimates 703 from each of the sub-decoders. Then, the reliability assigner 751 updates the particular bit estimates that the assigner has received to match the currently most reliable values. The assigner then transmits the most reliable bit estimates 702 to the sub-decoders.

The termination checker 752 determines whether the currently most reliable bit estimates correspond to a codeword of the error-correcting code, or whether another termination condition has been reached. In the preferred embodiment, the alternative termination condition is a pre-determined number of iterations. If the termination checker determines that the decoder should terminate, then the termination checker outputs a set of bit values 705 corresponding to a code-word, if a code-word was found, or otherwise outputs a set of bit values 705 determined using the most reliable bit estimates.

The description that we have given so far of our invention is general and applies to any conventional iterative decoder, including BP and BF decoders of LDPC codes, turbo-codes, and turbo product codes. Other codes to which the invention can be applied include irregular LDPC codes, repeat-accumulate codes, LT codes, and Raptor codes. We now focus on the special cases of turbo-codes and turbo product codes, in order to further describe details for these codes.

Combined Decoder for Turbo-Codes

To describe in more detail how the combined decoder can be generated for a turbo-code, we use as an example a turbo-code that is a concatenation of two binary systematic convolutional codes. We describe in detail a preferred implementation of the combined decoder for this example.

A conventional turbo decoder has two soft-input/soft-output convolutional BCJR decoders, which exchange reliability information, for the k information symbols that are shared by the two codes.

To generate the combined decoder for turbo-codes, we consider a parallel-mode turbo-decoder to be our input "conventional iterative decoder" 501. The relevant "bit estimates" are the log-likelihood ratios that the information bits receive from each of the convolutional codes. We refer to these log-likelihood ratios as "messages" from the codes to the bits.

In the preferred embodiment, we use four replica sub-decoders to generate the combined-replica group-shuffled decoder for turbo-codes constructed from two convolutional codes.

An ordering by which the messages are updated for each replica sub-decoder is assigned to each sub-coder. This can be done in many different ways, but it makes sense to follow the BCJR method, as closely as possible. In a conventional BCJR decoding "sweep" for a single convolutional code, each message is updated twice, once in a forward sweep and once in a backward sweep. The final output log-likelihood ratio output by the BCJR method for each bit is normally the message following the backward sweep. It is also possible to get equivalent results by updating the bits in a backward sweep followed by a forward sweep.

Figure 8:
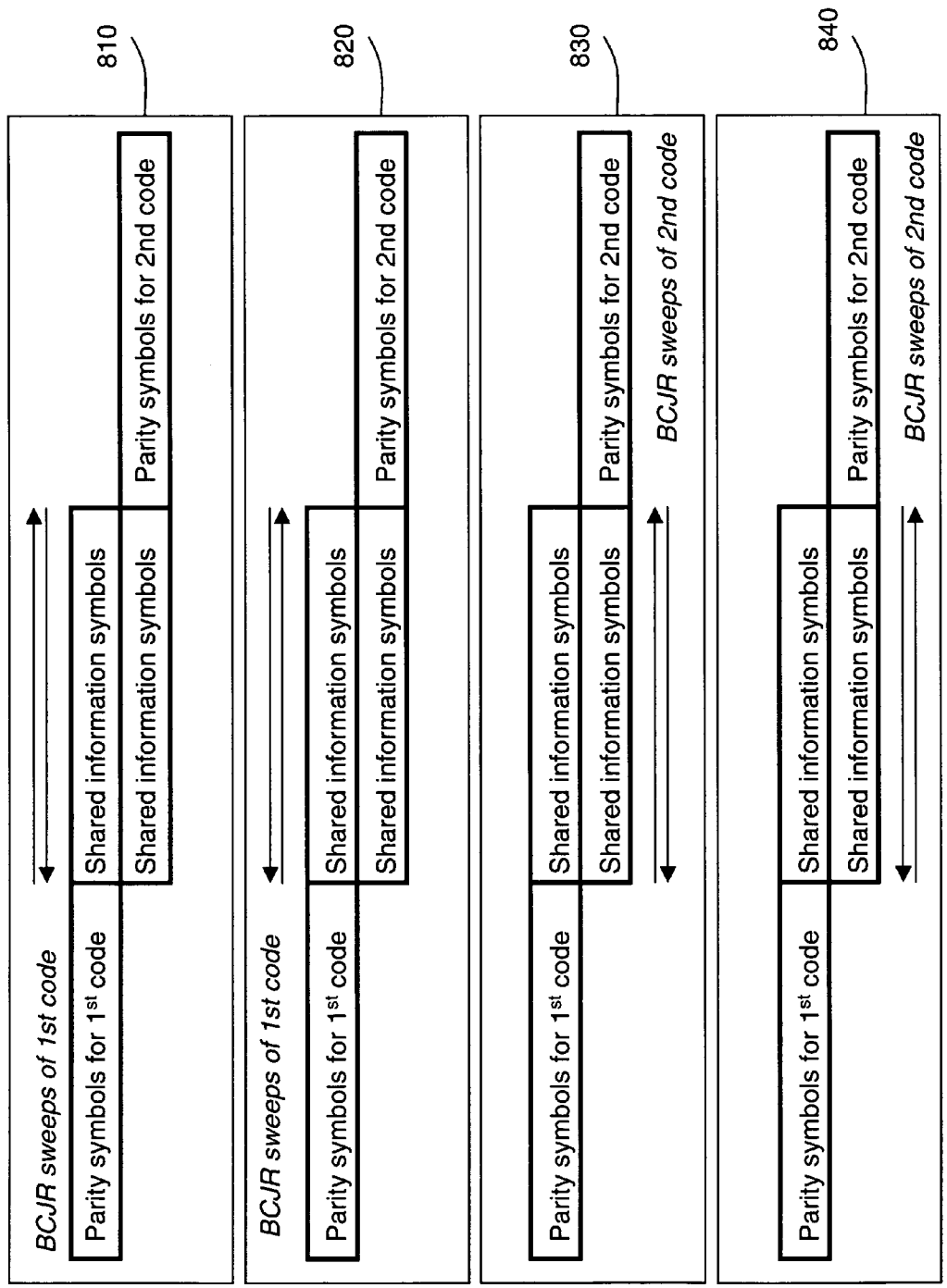
FIG. 8 is a diagram of replicated sub-decoder schedules for a combined decoder for a turbo-code.

In our preferred embodiment, as shown in FIG. 8, the four replica sub-decoders are assigned the following updating schedules. In each replica sub-decoder, each single message is considered a group. The first replica sub-decoder 810 updates only the messages from the first convolutional code using the forward sweep of the schedule followed by a backward sweep of the schedule. The second replica sub-decoder 820 updates only the messages from the first convolutional code using a backward sweep followed by a forward sweep. The third replica sub-decoder 830 updates only the messages from the second convolutional code using a forward sweep followed by a backward sweep. The fourth replica sub-decoder 840 updates only the messages from the second convolutional code using a backward sweep followed by a forward sweep.

As each bit message is updated in each of the four replica sub-decoders, other messages are needed to perform the update. In the combined decoder, the message is obtained from that the replica sub-decoder which most recently updated the estimate.

Combined Decoder for Turbo Product Codes

We now describe the preferred embodiment of the invention for the case of turbo product codes (TPC). We assume that the turbo product code is constructed from a product of a horizontal code and a vertical code. Each code is decoded using a exact-symbol decoder. We assume that the exact-symbol decoders output log-likelihood ratios for each of their constituent bits.

To generate the combined decoder for turbo product codes, we consider a parallel-mode turbo product decoder to be our input "conventional iterative decoder" 501. The relevant "bit estimates" are the log-likelihood ratios output for each bit by the symbol-exact decoders for the horizontal and vertical sub-codes. We refer to these bit estimates as "messages."

In the preferred embodiment, we use two replica sub-decoders that process successively the vertical codes and two replica sub-decoders that process successively the horizontal codes to generate the combined decoder for such a turbo product code. In the replica sub-decoders which successively process the vertical codes, the messages from those vertical codes are partitioned into groups such that messages from the bits in the same vertical code belong to the same group. In the replica sub-decoders which successively process the horizontal codes, the messages from the horizontal codes are partitioned into groups such that messages from the bits in the same horizontal code belong to the same group.

In the preferred embodiment for turbo product codes, the updating schedules for the different replica sub-decoders are as follows. In the first replica sub-decoder that processes vertical codes, the vertical codes are processed one after the other moving from left to right, while in the second replica sub-decoder that processes vertical codes, the vertical codes are processed one after the other moving from right to left. In the third replica sub-decoder that processes horizontal codes, the horizontal codes are processed one after the other moving from top to bottom. In the fourth replica sub-decoder that processes horizontal codes, the horizontal codes are processed one after the other moving from bottom to top.

At any stage, if a message is required, it is provided by the replica sub-decoder that most recently updated the message.

EFFECT OF THE INVENTION

Simulations with the combined decoder according to the invention show that the combined decoder provides better performance, complexity and speed trade-offs than prior art decoders. The replica shuffled turbo decoder invention outperforms conventional turbo decoders by several tenths of a dB if the same number of iterations are used, or can use far fewer iterations, if the same performance at a given noise level is required.

Similar performance improvements result when using the invention with LDPC codes, or with turbo-product codes, or any iteratively decodable code.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for generating a combined-replica group-shuffled iterative decoder, comprising:

receiving an error-correcting code and an iterative decoder for an error-correcting code;

constructing multiple group-shuffled sub-decoders for the error-correcting code based on the iterative decoder;
partitioning, for each group-shuffled sub-decoder, estimates for symbols into groups;
assigning, for each group-shuffled sub-decoder, a schedule for the updating;
updating the estimates according to the schedule; and
combining the multiple group-shuffled sub-decoders into a combined-replica group-shuffled iterative decoder.

2. The method of claim 1, in which the error-correcting code is binary, and the symbols are bits.

3. The method of claim 2, in which the group-shuffled sub-decoders use belief propagation and the estimates are messages, and the messages represent log-likelihoods that the bits are either a 0 or a 1.

4. The method of claim 2, in which the group-shuffled sub-decoders use bit-flipping, and the estimates are states of the bits of the code-word.

5. The method of claim 1, in which the error-correcting code is a binary low-density parity check code.

6. The method of claim 1, in which the groups are of equal size.

7. The method of claim 1, in which the group-shuffled sub-decoder uses belief propagation and the groups are formed using a vertical partition.

8. The method of claim 1, in which the group-shuffled sub-decoder uses belief propagation and the groups are formed using a horizontal partition.

9. The method of claim 1, in which the schedule defines an order in which the groups are updated.

10. The method of claim 1, in which the groups are partitioned identically in the sub-decoders.

11. The method of claim 1, in which the groups are partitioned differently in the sub-decoders.

12. The method of claim 1, in which the schedule for each group-shuffled sub-decoder is different.

13. The method of claim 1, in which each estimate is updated by at least one of the group-shuffled sub-decoders.

14. The method of claim 1, in which the group-shuffled iterative sub-decoders update the estimates synchronously.

15. The method of claim 1, further comprising:
using most reliable symbol estimates during the updating.

16. The method of claim 15, in which the most reliable symbol estimates are obtained from a particular sub-decoder that updated the estimate most recently.

17. The method of claim 1, in which the error-correcting code is a turbo code.

18. The method of claim 17, in which the turbo-code is a concatenation of two binary systematic convolutional codes.

19. The method of claim 18, in which four sub-decoders are used in the combined decoder.

20. The method of claim 19, in which one sub-decoder decodes the first convolutional code using Bahl, Cocke, Jelinek and Raviv (BCJR) decoding with a forward sweep followed by a backward sweep, a second sub-decoder decodes the first convolutional code using the BCJR decoding with a backward sweep followed by a forward sweep, a third sub-decoder decodes the second convolutional code using the BCJR decoding with a forward sweep followed by a backward sweep, and the fourth sub-decoder decodes the second convolutional code using the BCJR decoding with a backward sweep followed by a forward sweep.

21. The method of claim 1, in which the error-correcting code is a turbo product code.

22. The method of claim 21, in which the turbo-product code is a product of horizontal and vertical codes.

23. The method of claim 22, in which four sub-decoders are used in the combined decoder.

24. The method of claim 23, in which a first sub-decoder decodes the horizontal codes from top to bottom, a second sub-decoder decodes the horizontal codes from bottom to top, a third sub-decoder decodes the vertical codes from left to right, and a fourth sub-decoder decodes the vertical codes from right to left.

25. The method of claim 1, in which the error-correcting code is an irregular low density parity check code.

26. The method of claim 1, in which the error-correcting code is a repeat-accumulate code.

27. The method of claim 1, in which the error-correcting code is a Luby Transform (LT) code.

28. The method of claim 1, in which the error-correcting code is a Raptor code.

29. The method of claim 1, in which the error-correcting code is an iteratively decodable code.

30. The method of claim 1, in which the error-correcting code is a non binary codes.

31. The method of claim 1, in which the symbols are taken from an arbitrary alphabet.

32. A combined-replica group-shuffled iterative decoder, comprising:
a plurality of group-shuffled sub-decoders constructed from an iterative decoder for an error-correcting code, each group-shuffled sub-decoder configured to receive channel information;
a control block connected to each of the group-shuffled sub-decoders, the control block further comprising:
a reliability assigner, the reliability checker configured to receiver bit estimates from each of the group-shuffled sub-decoders, and to output to each group-shuffled sub-decoder most reliable bit estimates;
means for assigning an updating schedule to each of the group-shuffled sub-decoders; and
a termination checker configured to output the most reliable bit estimates corresponding to the channel information when a termination condition has been reached.

33. The decoder of claim 32, in which the error-correcting code is a turbo-code constructed from a concatenation of a plurality of convolutional codes.

34. The decoder of claim 32, in which a first sub-decoder updates only messages from a first convolutional code using a forward sweep of the schedule followed by a backward sweep of the schedule, a second sub-decoder updates only the messages from the first convolutional code using the backward sweep followed by the forward sweep, a third decoder updates messages from a second convolutional code using the forward sweep followed by the backward sweep, and a fourth sub-decoder updates the messages from the second convolutional code using the backward sweep followed by the forward sweep.

35. The decoder of claim 32, in which the updating schedule is different for each of the group-shuffled sub-decoders.

* * * * *